(12) United States Patent
Kojima

(10) Patent No.: US 6,670,678 B2
(45) Date of Patent: Dec. 30, 2003

(54) SEMICONDUCTOR DEVICE HAVING ESD PROTECTIVE TRANSISTOR

(75) Inventor: Toshiaki Kojima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/377,477

(22) Filed: Feb. 28, 2003

(65) Prior Publication Data

US 2003/0164521 A1 Sep. 4, 2003

(30) Foreign Application Priority Data

Mar. 4, 2002 (JP) ........................................ 2002-056899

(51) Int. Cl.[7] .............................................. H01L 23/62
(52) U.S. Cl. ........................................ 257/355; 257/360
(58) Field of Search ................................ 257/355, 360, 257/361, 506, 510

(56) References Cited

U.S. PATENT DOCUMENTS 6,566,715 B1 * 5/2003 Ker et al. ................... 257/355

* cited by examiner

Primary Examiner—Mark V. Prenty
(74) Attorney, Agent, or Firm—Hogan & Hartson

(57) ABSTRACT

An insulation trench is formed between a drain region formed in a p-type well and a substrate contact region of GG NMOS transistor. The insulation trench extends deeper than the thickness of the p-type well and reaches the p-type substrate of the transistor. This configuration provides a parasitic BJT of the ESD protection transistor with an improves TLP characteristic, and facilitates the operation of the parasitic BJT of the GG MOS transistor accordingly.

20 Claims, 9 Drawing Sheets

SEMICONDUCTOR DEVICE HAVING ESD PROTECTIVE TRANSISTOR

FIELD OF THE INVENTION

The invention relates to a semiconductor integrated circuit (IC) device having an electrostatic discharge (ESD) protection transistor.

BACKGROUND OF THE INVENTION

Advancement of sub-micron integration technologies in the production of integrated circuit (IC) devices has necessitated improvement of ESD resistance property of the ICs. In order to avoid destruction of IC devices by ESD, a protective circuit against ESD (referred to as ESD protective circuit) is provided in the I/O circuit of an IC.

FIG. 1 illustrates a structure of a gate-grounded (GG) NMOS transistor serving as an ESD protection transistor of a conventional IC. As shown in FIG. 1, an n$^+$ drain region and an n$^+$ source region are formed in the MOS region in a p-type well Pwell formed in a p-type substrate Psub. A source S and a drain D are formed by forming contacts on the respective source and drain regions. A gate G is formed above the channel region which lies between the drain and source regions.

The gate G and the source S are grounded and the drain D is connected to the line to be protected. The p$^+$ substrate contact region and the contact formed thereon together constitute a substrate contact Csub. The substrate contact Csub is grounded so as to be clamped to the ground potential. Formed between the n$^+$ drain region and the p$^+$ substrate contact region is an isolation region Ts for securing a withstand voltage. The isolation region Ts can be a Local Oxidation Silicon (LOCOS) or a Shallow Trench Isolation (STI). The example shown herein utilizes an STI in order to secure a minute isolation width. This SIT has been formed as shallow as possible for ease of fabrication and minimization of manufacturing time of the IC so long as withstanding voltages are secured and inter-element leaks are prevented.

The drain region, p-type well region, and source region of this GG NMOS transistor together form a parasitic bipolar junction transistor BJT (referred to as parasitic BJT). When the drain D is positively charged due to ESD, the charge results in electron-hole pairs in the drain region, which in turn results in a current from an equivalent current source I1 that flows through the p-type well region Pwell.

FIG. 2 shows a graph of drain voltage Vd versus drain current Id of a typical Vd-Id characteristic. It is seen that the parasitic BJT becomes conducting and enters a snapback region (labeled as ii in FIG. 2) as the voltage drop caused by the current flowing from the current source I1 through the resistance Rw of the p-type well region Pwell exceeds the trigger voltage Vtrig of the parasitic BJT (at point i of FIG. 2), This causes the GG NMOS channel to become conductive, thereby permitting the drain current to flow from the drain D to the source S, and allowing the charge fed to the drain D to be absorbed by the ground. As a consequence, the device is prevented from being destructed.

The Vd-Id characteristic shown in FIG. 2 is called transmission line pulsing (TLP) characteristic or snapback characteristic. The magnitude of the trigger voltage Vtrig for triggering the parasitic BJT is important in determining the protection capability of the ESD protection transistor.

Advancement of miniaturization and integration of circuits have led to a large scale IC (LSI) in which a MOS transistor inside the core thereof has a highly doped p-type well region Pwell and reduced resistance. Accordingly, the trigger voltage Vtrig of its TLP characteristic tends to become higher. As a consequence, a parasitic BJT becomes more difficult to operate and losing its ESD capability. When the trigger voltage Vtrig becomes very high that it exceeds the breakdown voltage of the MOS transistor, the MOS transistor can break down and gets destroyed. Hence, it is necessary to hold the trigger voltage Vtrig below the breakdown voltage of the MOS transistor.

SUMMARY OF THE INVENTION

It is therefore an object of the invention to provide an IC having an ESD protection transistor formed in a highly doped well region and yet having an improved TLP characteristic for satisfactory ESD protection of the IC.

In accordance with one aspect of the invention, there is provided an IC having an ESD protection transistor, the ESD protection transistor comprising:

a first conductivity type (referred to as p-type or p) well formed in a p-type substrate;

a second conductivity type (referred to as n-type or n) source region formed in the p-type well;

an n-type drain region formed in the p-type well, away from the source region across a channel region;

a p-type substrate contact region formed in the p-type well and on at least the opposite side of the channel region with respect to the drain region;

a gate formed above, and insulated from, the channel region; and an insulation trench that extends to a depth beyond the thickness of the p-type well and reaching the p-type substrate, the insulation trench formed between at least the drain region and the substrate contact region.

An IC of the invention has an insulation trench formed between a drain region and a substrate contact region, extending beyond the thickness of the p-type well in which the drain region is formed, to the p-type substrate. This configuration leads to an increase of base resistance of the parasitic BJT, which facilitates an easy rise of the base voltage at the time an electric charge is input to the drain region. Hence, it makes easy for the parasitic BJT of the ESD protection transistor to operate promptly and provide improved ESD protection capability.

The ESD protection capability can be secured by simply increasing only the depth (that is, without increasing the width) of the insulation trench, which has traditionally formed shallow to provide a withstand voltage between the drain region and the substrate contact region. It is thus not necessary to increase the area of the ESD transistor or add any extra process in order to increase the resistance of the parasitic BJT. Thus, the ESD transistor is cost effective.

Since the resistance of the ESD protection transistor can be adjusted by controlling the depth of the insulation trench, desired protective characteristics of the ESD transistor can be easily obtained.

In accordance with another aspect of the invention, there is provided an IC having an ESD protection transistor, the ESD protection transistor comprising:

a p-type well formed on a p-type substrate;

an n-type source region formed in the p-type well;

an n-type drain region formed in the p-type well and away from the source region across a channel region;

a p-type substrate contact region formed in the p-type substrate and on at least the opposite side of the channel region with respect to the drain region;

a gate formed above, and insulated from, the channel region; and an insulation trench that extends to a depth beyond the thickness of the p-type well, the insulation trench formed between at least the drain region and the substrate contact region.

Since an IC of this embodiment of the invention is provided with a substrate contact formed directly on the p-type substrate, the resistance of the ESD protection transistor is made higher than that of conventional one, thereby successfully suppressing the operational voltage of the parasitic BJT of the ESD protection transistor.

In accordance with another aspect of the invention, there is provided an IC having an ESD protection transistor, said ESD protection transistor comprising:

a first n-type well formed on a p-type substrate;

a second n-type well formed in the first n-type well;

a p-type source region formed in the second n-type well;

a p-type drain region formed in the second n well, away from the source region across a channel region;

an n-type substrate contact region formed in the second n-type well, on at least the opposite side of the channel region with respect to the drain region;

a gate formed above, and insulated from, the channel region; and an insulation trench that extends to a depth beyond the thickness of the first n-type well and reaching the first n well, and formed between the drain region and the substrate contact region.

This type of IC is provided with an ESD protection transistor in the form of a p-type MOS that comprises: a lightly doped first n-type well and a second n-type well that is doped slightly higher than the first n well formed in a p-type substrate; and an insulation trench that extends to a depth that reaches the lightly doped first n well. This PMOS transistor allows the parasitic BJT to operate easier under a negatively polarized surge, enhancing the ESD protection capability of the BJT.

In accordance with still another aspect of the invention, there is provided an IC having an ESD protection transistor, the ESD protection transistor comprising:

a first n-type well formed on a p-type substrate;

a second n-type well formed in the first n-type well;

a p-type source region formed in the second n-type well;

a p-type drain region formed in the second n-type well and away from the source region across a channel region;

an n-type substrate contact region formed in the first n-type well and on at least the opposite side of the channel region with respect to the drain region;

a gate formed above, and insulated from, the channel region; and an insulation trench that extends to a depth beyond the thickness of the second n-type well and formed between the drain region and the substrate contact region.

This type of IC has a lightly doped first n-type well formed directly on a substrate contact, so that ESD protection transistor has an increased resistance, which reduces the operational voltage of the parasitic BJT of the ESD protection transistor.

In accordance with a further aspect of the invention, there is provided an IC, comprising:

a transistor having:

a highly doped p-type well formed in a semiconductor substrate;

an n-type source region formed in the p-type well;

an n-type drain region formed in the p-type well and away from the source region across a channel region;

a gate formed above, and insulated from, the channel region; and a p-type substrate contact region formed in the p-type well but on at least the opposite side of the channel region with respect to the drain region, an insulation trench formed between at least the drain region and the substrate contact region, and an internal circuit connected to the drain region, wherein the gate, source region, and substrate contact region are connected to the same potential;

the insulation trench has a depth such that the transistor becomes conductive due to an anomalous voltage entering the drain region before the internal circuit or the transistor is destructed by the anomalous voltage.

In this embodiment of an IC of the invention, the insulation trench is formed between the drain region and the substrate contact region sufficiently deep so that the protection transistor becomes conductive before the internal circuit or the protection transistor is destructed by an anomalous voltage entering the drain region. As a consequence, the base resistance of the parasitic BJT can be easily increased to raise the base voltage thereof when a charge is input to the drain region. Thus, the parasitic BJT of the ESD protection transistor can easily exercise its protective function, and that provides an improved ESD protection performance.

DETAILED DESCRIPTION OF THE PREFERRED EMBODIMENTS

Figure 3:
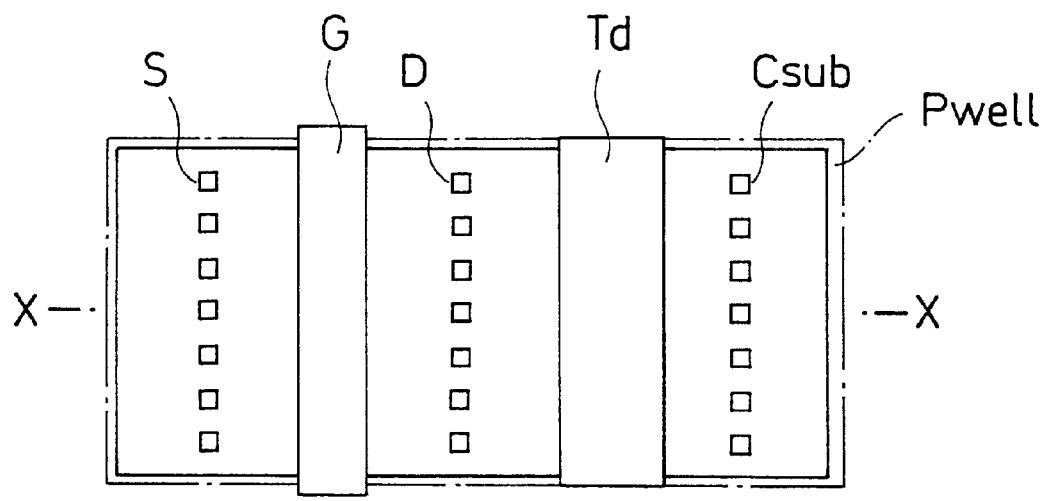
FIGS. 3(a) and (b) schematically show a structure of a first embodiment of an NMOS ESD protection transistor according to the invention.
Figure 3:
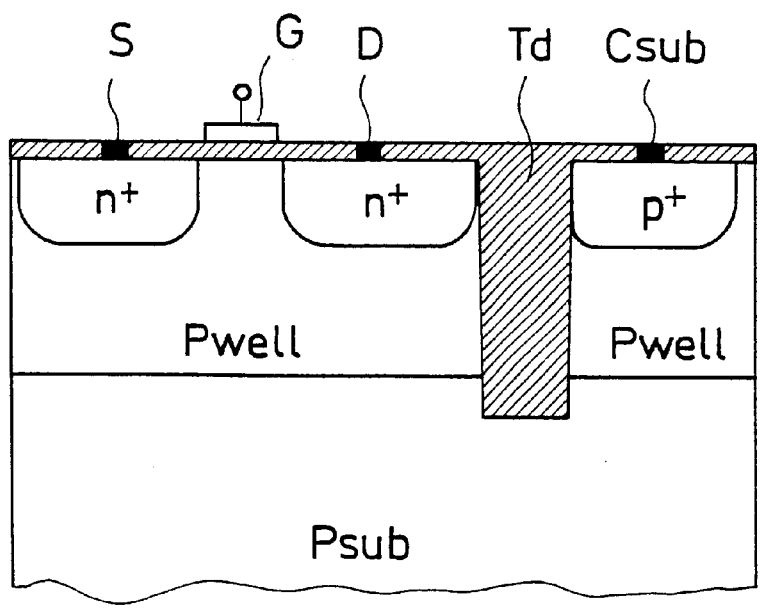

Referring to FIG. 3, there is shown a first embodiment of an NMOS type ESD protection transistor according to the invention. FIG. 3(b) is a cross sectional view of the NMOS transistor taken along line X—X of the plan view of FIG. 3(a). FIG. 3 shows only a portion of the ESD protection transistor formed in an IC. It is noted that FIG. 3(b) shows the cross section of the ESD protection transistor with its insulating oxide layer (e.g. $SiO_2$) lying on the gate oxide layer and lead wires connected to respective contacts omitted. This is the case with other cross sectional views.

As shown in FIG. 3(b), a p-type well Pwell is formed in a p-type substrate Psub. The ESD protection transistor in the form of an NMOS transistor is formed in the p-type well Pwell. The drain of the NMOS transistor is connected to the respective input and output terminals (pads).

The $n^+$ type source region and $n^+$ type drain region are formed in this p-type well, separated by a channel region. Formed on the channel region is a gate G intervened by an insulating oxide layer (such as $SiO_2$) shown as a hatched section in FIG. 3(b). A $p^+$ substrate contact region is formed in the p-type well, on the opposite side of the channel region with respect to the drain region. Contacts are formed on these source region, drain region, and substrate contact region to form a source S, a drain D, and a substrate contact Csub, respectively.

Formed between the drain region and the substrate contact region is a deep insulation trench Td extending to a depth beyond the thickness of the p-type well Pwell and reaching the p-type substrate Psub. This deep insulation trench Td may be called deep isolation trench (DIT) in contrast to a conventional shallow trench isolation (STI). It is noted that the insulating trench Td can be insulating $SiO_2$ for example.

Figure 4:
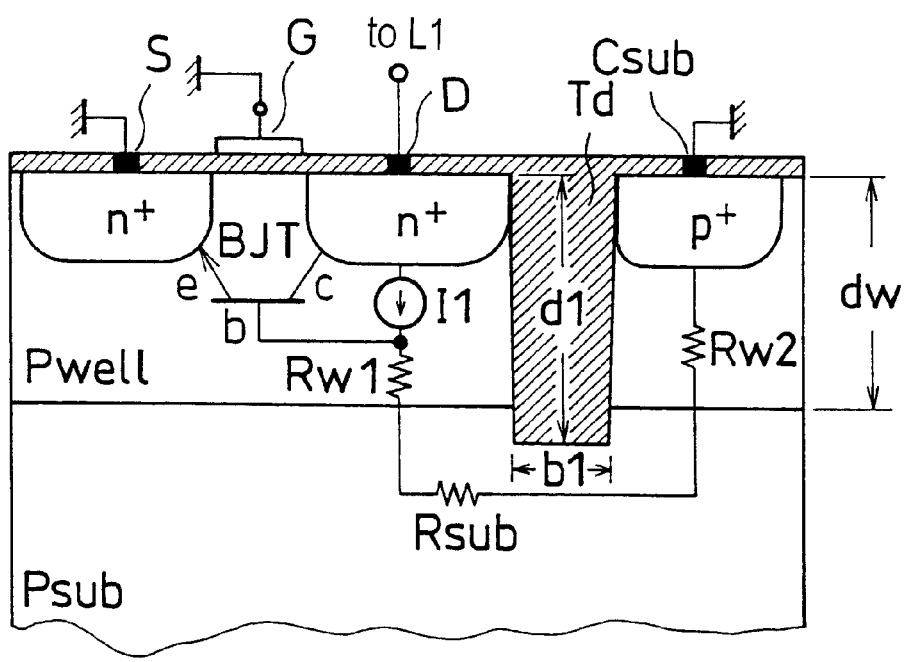
FIG. 4 is an equivalent circuit of an NMOS ESD protection transistor of the first embodiment.

Referring to FIG. 4, operations of the NMOS ESD protection transistor of the first embodiment will now be described.

As shown in FIG. 4, the gate G and the source S are grounded. The drain D is connected to a line L1, which is connected to an internal circuit to be protected or input or output terminals. The substrate contact Csub is coupled to the ground potential, which is used as a reference potential. A parasitic BJT, formed of a drain region (collector c), p-type well region (base b), and a source region (emitter e), is also formed in the GG NMOS transistor.

Structural arrangements of the GG NMOS transistor and other elements to form the protection circuit of this embodiment will be described below.

The GG NMOS transistor is connected between the protection line L1 and the ground potential Vgnd (or a second supply potential Vss). A GG type PMOS transistor is connected between the protection line L1 and a first supply potential Vdd. The gate and source of the GG PMOS transistor are connected to the supply potential Vdd, and the drain of the transistor is connected to the protection line L1. In addition, a first protection diode is connected between the ground potential Vgnd and the protection line L1 (that is, in parallel with the GG NMOS transistor) in the forward direction toward the protection line L1. A second protection diode is connected between the supply potential Vdd and the protection line L1 (that is, in parallel with the GG PMOS transistor) in the forward direction towards the supply potential Vdd. The first or the second diode may be omitted as needed.

In this way, a protection circuit is formed using a GG NMOS transistor and GG PMOS transistor in combination with a generally accepted first and second protection diodes. This, the protection circuit of the invention can properly protect different types of use conditions of ICs against ESD. For example:

(i) A positive ESD is absorbed mainly by the GG NMOS transistor when the terminal of the protection circuit to be connected to the ground Vgnd is grounded and the terminal to be connected to the supply potential Vdd open;

(ii) A negative ESD mainly by the GG PMOS transistor when the terminal to be connected to the supply potential Vdd is grounded and the terminal to be connected to the ground Vgnd is open;

(iii) A negative ESD is absorbed mainly by the first protection diode when the terminal to be connected to the ground Vgnd is grounded and the terminal to be connected to the supply potential Vdd is open;

(iv) A positive ESD is absorbed mainly by the second protection diode when the terminal to be connected to the supply potential Vdd is grounded and the terminal to be connected to the ground Vgnd is open.

Referring back to FIG. 4, operations of the GG NMOS transistor will now be described. As a positive ESD charge enters, a surge current flows into the drain D, bringing the drain region to a high voltage. Because of this high voltage, an avalanche breakdown will take place across the boundary of the drain region and the p-type well Pwell, creating electron-hole pairs. The holes are attracted to the p-type substrate Psub, resulting in a current flowing from an equivalent current source I1 as shown in FIG. 4.

The resultant current first flows from the drain region of the drain D to the p-type well Pwell, and down to the ground through the p-type substrate Psub, p-type well Pwell, the substrate contact region, and substrate contact Csub in turn.

Let the resistances on the opposite sides of the insulation trench of the p-type well Pwell be denoted by Rw1 and Rw2, and the resistance of the p-type substrate Psub by Rsub. The voltage Vb of the base b of the parasitic BJT will be increased by these resistances an amount given by $$Vb=I1\times(Rw1+Rsub+Rw2).$$

In the above calculation, the voltage drop due to the resistance R of the $p^+$ substrate contact region has been neglected, since the resistance R given by $$R=1/(q\cdot\mu p\cdot Np),$$

where q is the amount of charge on the contact region, $\mu p$ is the mobility of the holes, and Np is the impurity concentration in the substrate contact region, is extremely small.

Figure 1:
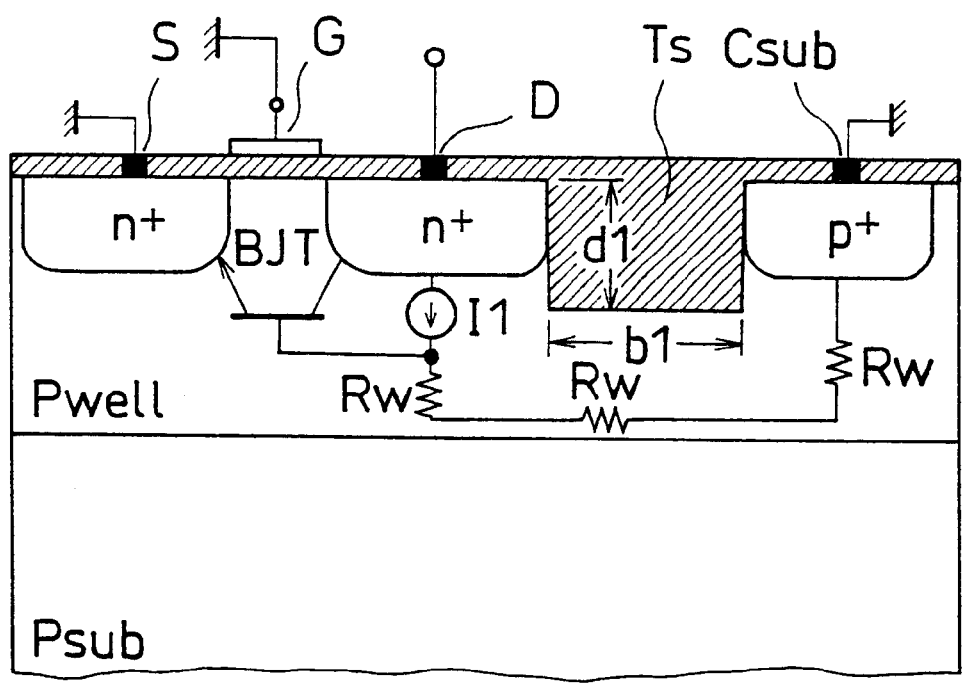
FIG. 1 is a cross sectional view showing a structure of a conventional GG NMOS transistor.
Figure 2:
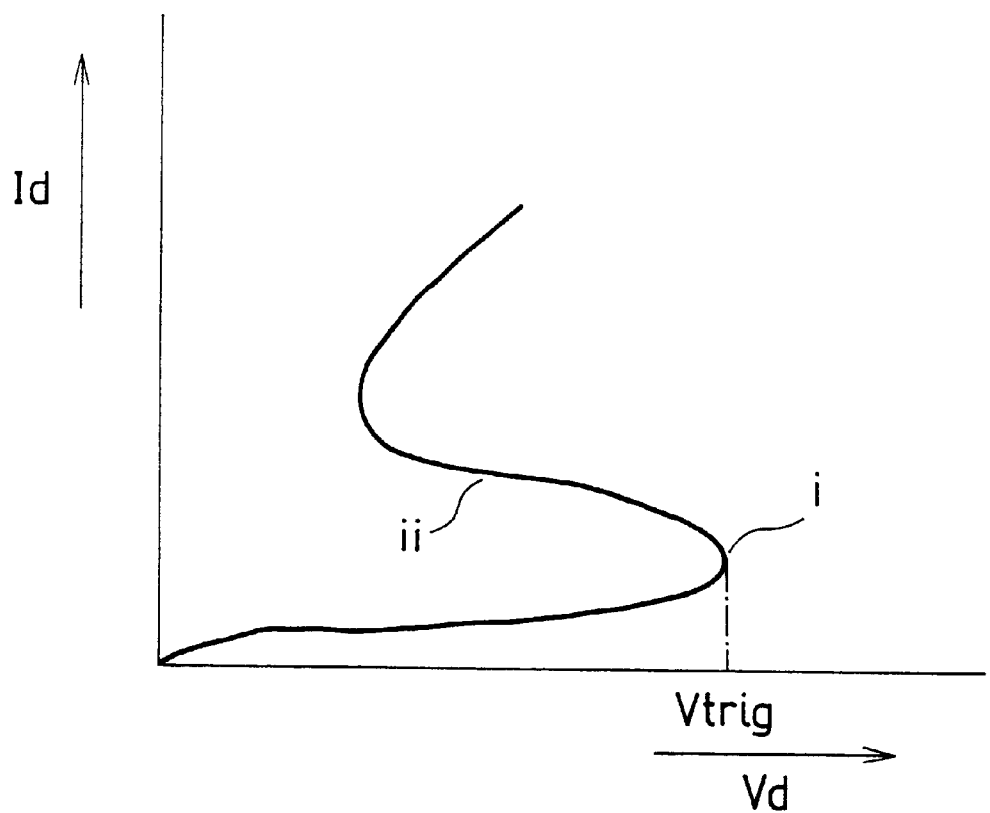
FIG. 2 is a graph showing a characteristic curve of the drain voltage versus drain current of the NMOS transistor shown in FIG. 1.
Figure 5:
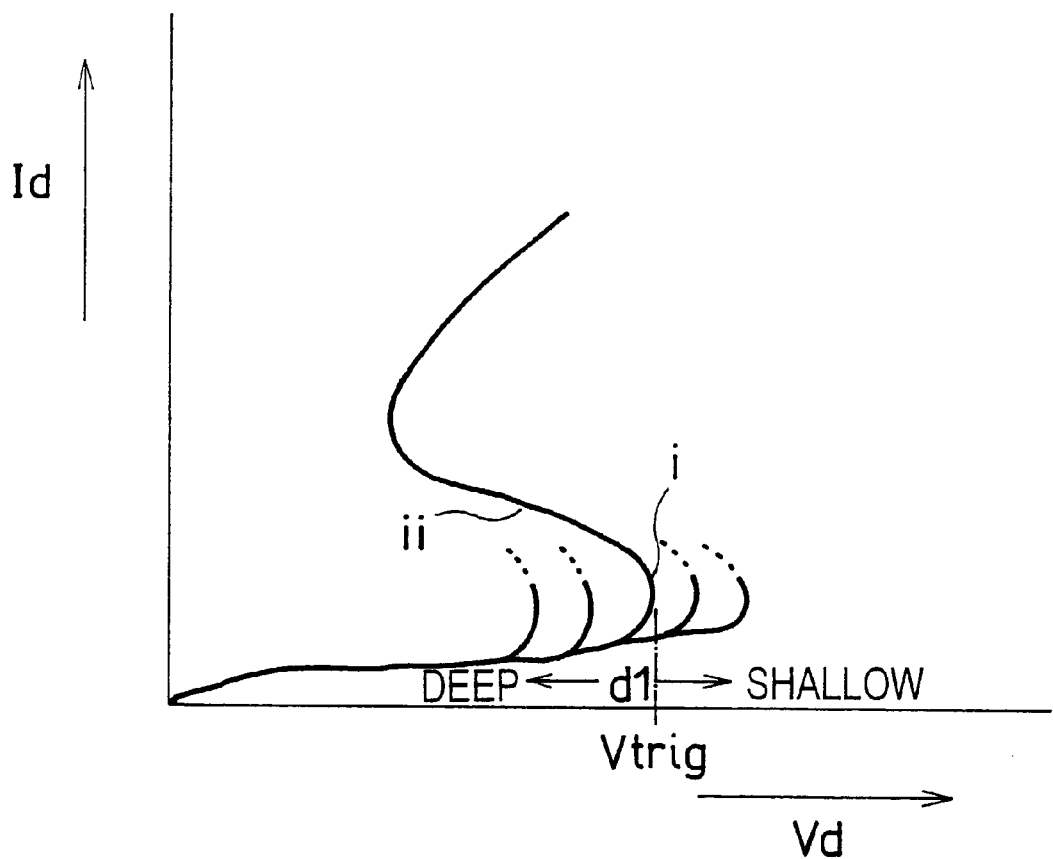
FIG. 5 shows a characteristic curve of the drain voltage versus drain current of the NMOS transistor shown in FIG. 4.

As the base voltage Vb exceeds the trigger voltage Vtrig of the TLP characteristic shown in FIG. 5, a forward bias is created across the base b of the parasitic BJT and the emitter e, as in a conventional parasitic BJT as shown in FIG. 1, which bias causes a portion of a surge current from the drain D to flow to the source S. This corresponds to an event at a critical point i of the TLP characteristic shown in FIG. 5. The voltage-current relationship exhibits a negative resistance characteristic past this point i as indicated by a curve ii in FIG. 5. As the parasitic BJT turns on, the current runs down from the drain D to the source S. The trigger voltage Vtrig varies with the depth of the insulation trench Td, as shown in FIG. 5.

Based on the geometrical proportion conversion, the base voltage Vb at base b of the parasitic BJT is given by $$Vb=I1\times[Rwu\times dw\times 2+Rsubu\times\{(d1-dw)\times 2+b1\}],$$

where I1 is a maximum permissible junction leak current, d1 the depth of the insulation trench Td, dw the depth of the p-type well Pwell, b1 the width of the insulating trench Td, Rwu the resistance per unit length (1 micrometer; likewise hereafter) of the p-type well Pwell, and Rsubu the resistance per unit length of p-type substrate Psub.

It is assumed here that the maximum permissible current I1 is 50 mA, the depth dw 1.0 micrometer, the width b1 0.5 micrometer, the resistance Rwu 1.0 Ohm, and the resistance Rsubu 10 Ohms. As an example, the total resistance Rtot and the voltage Vb is calculated for a typical case of d1>dw, in particular for d1=1.2, 1.6, and 2.0 micrometers, as shown in Table 1 below.

As a comparison, the voltage Vb at the base b of a parasitic BJT having a conventional isolation trench Ts is calculated with reference to FIG. 1. The voltage is given by $$Vb = I1 \times (Rwu \times d1 \times 2 + Rwu \times b1),$$

where the values of the parameters appearing in this equation are the same as for the embodiment of the invention, except for the depth d1 of the isolation trench Ts.

Table 1 below compares the total resistances Ttot and the base voltages Vb of conventional ESD protection transistors having shallow isolation trenches Ts of depth d1 smaller than the depth dw of a p-type well Pwell calculated for d1=0.4 and 0.8 micrometers, with corresponding total resistances and the base voltages Vb of the invention described above.

TABLE 1

|  |  | d1[μm] | Rtot[Ω] | Vb[v] |
|---|---|---|---|---|
| conventional | d1 < dw | 0.4 | 1.3 | 0.065 |
|  | d1 < dw | 0.8 | 2.1 | 0.105 |
| this invention | d1 > dw | 1.2 | 11.0 | 0.55 |
|  | d1 > dw | 1.6 | 19.0 | 0.95 |
|  | d1 > dw | 2.0 | 27.0 | 1.35 |

It is seen from Table 1 that with d1>dw the voltage Vd can reach the trigger voltage Vtrig (0.5 Volts) of the parasitic BJT by setting the depth d1 of the insulation trench Td at 1.2 micrometers. Even when the trigger voltage Vtrig is 0.6 Volts, it can be reached by the base voltage Vd by deepening the depth of the insulation trench Td to 1.6 micrometers. In this way, the insulation trench Td is formed sufficiently deep with its depth d1 reaching the p-type substrate Psub beyond the depth dw of the p-type well Pwell.

In contrast, in a conventional insulation trench having d1 (e.g. d1=0.8 micrometers) smaller than dw, the base voltage Vb is at most 0.105 Volts, which is far less than the trigger voltage Vtrig of the parasitic BJT even if the Vtrig is as low as 0.5 Volts. That is, the base voltage Vb will never exceeds the trigger voltage Vtrig. Hence, the conventional parasitic BJT cannot operate (i.e. cannot be triggered) under a conventional shallow trench isolation configuration. It is therefore necessary for the isolation trench Ts to have a width b1 as large as 6.25 micrometers in order to trigger the parasitic BJT at 0.5 Volts if the depth d1 of the isolation trench Ts is, for example, 0.8 micrometers. This implies that a conventional isolation trench requires a layout area about 12.5 times larger than that of the inventive insulation trench having a depth b1 of 0.5 micrometers.

It will be appreciated that the parasitic BJT of the invention can be securely triggered by providing the parasitic BJT with a DIT configuration in which the depth d1 of the insulation trench Td extends beyond the depth dw of the p-type well Pwell, reaching the p-type substrate Psub, without increasing its layout area. This insulation trench Td can be formed only by deepening its depth, requiring no extra process in the manufacture of a parasitic BJT.

Figure 6:
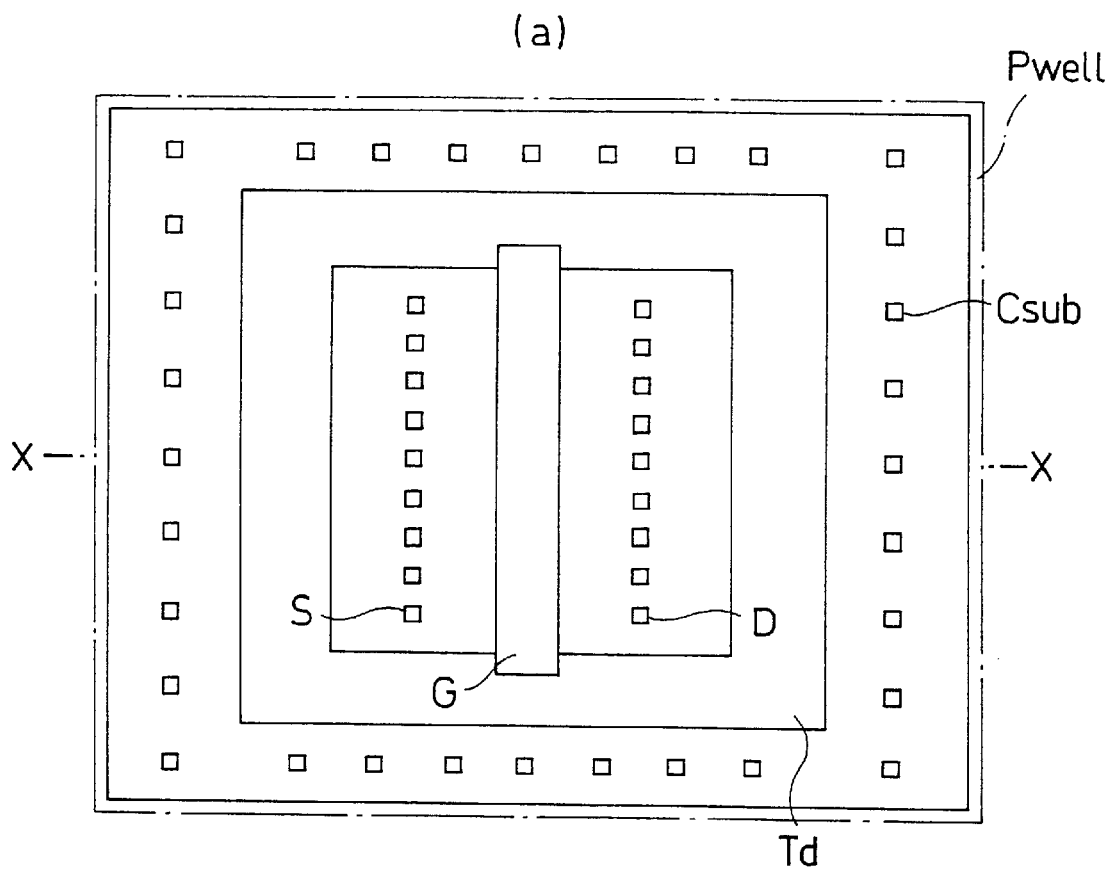
FIGS. 6(a) and (b) schematically show a structure of a second embodiment of an NMOS type ESD protection transistor according to the invention.
Figure 6:
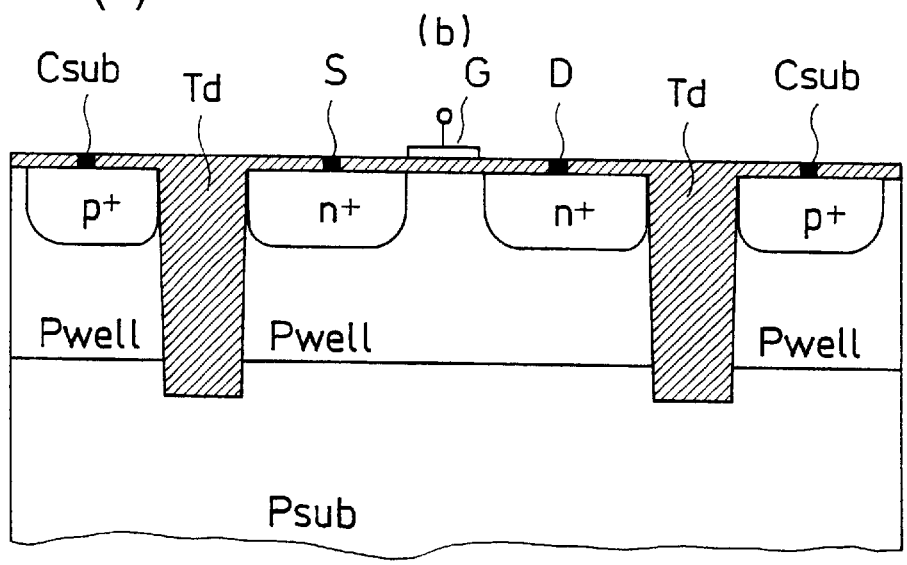

Referring to FIG. 6, there is shown a second embodiment of an NMOS ESD protection transistor of the invention. FIG. 6(a) is a schematic plan view of the NMOS transistor, and FIG. 6(b) is a schematic cross sectional view taken along line X—X of FIG. 6(a).

In the second embodiment of FIG. 6, a deep insulation trench Td is formed to surround drains D each formed of an $n^+$ drain region and a contact thereof, sources S each formed of an $n^+$ source region and a contact thereof, and channel regions extending between them. Arranged outside the deep insulation trench Td are substrate contacts Csub each formed of a $p^+$ substrate contact region and a contact.

In this arrangement, the deep trench has a guard ring configuration surrounding the drains D, sources S, and the channel regions. The configuration of the deep insulation trench Td is arbitrary. In fact it may be square, circular, or of any other shape.

FIG. 6 shows a 1-finger gate type MOS transistor. A 2-finger-gates type GG MOS transistor may be implemented by forming two gates on the opposite sides of the drains D and forming two sources outside the two gates.

Such guard ring configuration of the deep insulation trench Td as described above has an improved ESD protection performance.

Figure 7:
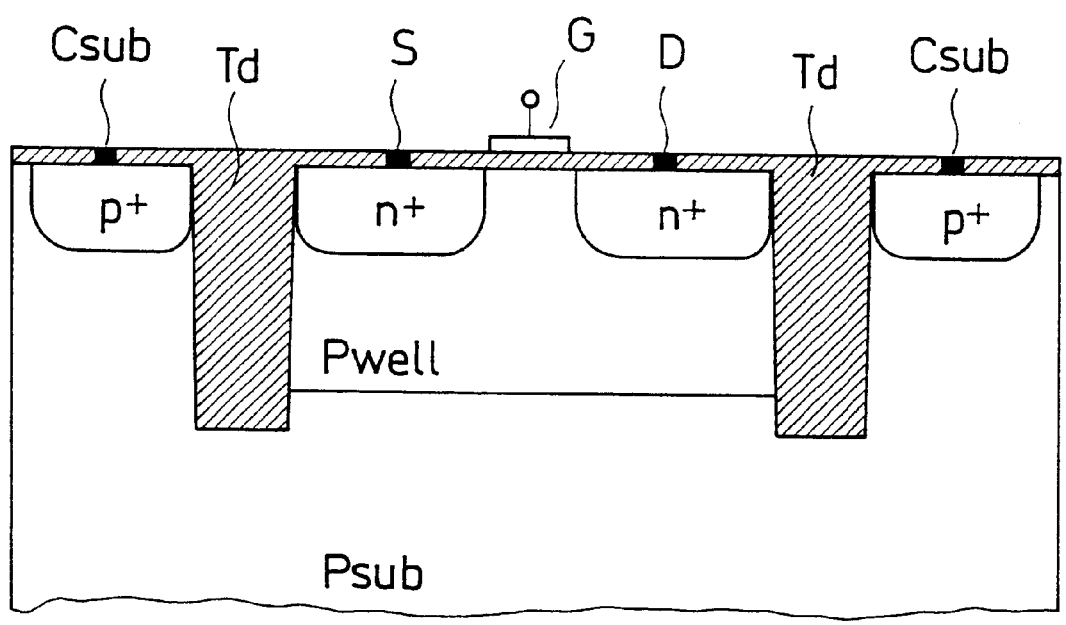
FIG. 7 shows a schematic cross section of a third embodiment of an NMOS ESD protection transistor according to the invention.

FIG. 7 shows a schematic cross section of a third embodiment of an NMOS ESD protection transistor.

In this embodiment, the deep insulation trench Td is also configured to surround drains D, sources S, and the channel regions, in the same manner as the second embodiment of FIG. 6.

As shown in FIG. 7, in a schematic cross section of a third embodiment, substrate contacts Csub are formed in the p-type substrate Psub that has not been doped with impurities to make a p-type well Pwell.

That is, a p-type well Pwell is formed for the highly doped drain D, source S, and the channel region working as a MOS transistor. On the other hand, the substrate contacts Csub are formed directly in the p-type substrate Psub, since the substrate contacts Csub, arranged outside the deep insulation trench Td and formed of a substrate contact region and a contact, can function without any problem if they are lightly doped.

This configuration can be easily obtained by simply adding an additional mask over the substrate contact region in the process of manufacturing the MOS transistor.

It should be noted that in this configuration a portion of the resistance Rw of the p-type well Pwell is replaced by the resistance of the p-type substrate Psub, so that the total resistance Ttot is further increased to facilitate better operation of the parasitic BJT. The voltage Vb applied to the base of the parasitic BJT can be raised accordingly. This further enhances ESD protection performance of the parasitic BJT.

Figure 8:
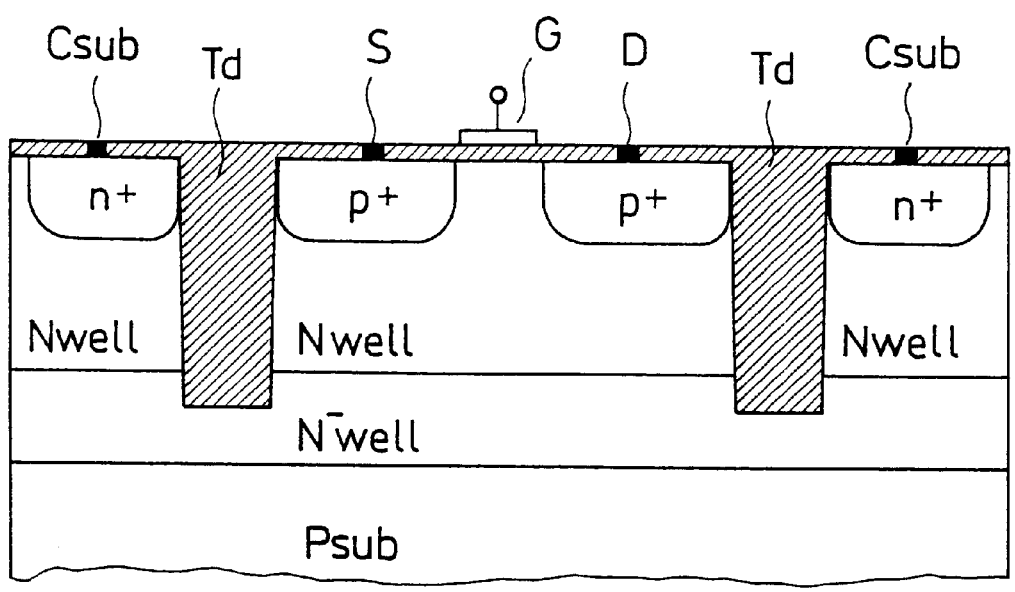
FIG. 8 shows a schematic cross section of a fourth embodiment of a PMOS ESD protection transistor according to the invention.

FIG. 8 shows a schematic cross section of a fourth embodiment of a PMOS type ESD protection transistor capable of preventing a damage caused by a negatively polarized surge according to the invention.

In the fourth embodiment shown in FIG. 8, a lightly doped first n-type well N-well is formed in the p-type substrate Psub, and a second n-type well Nwell is formed in the first n-type well N-well such that the second n-type well Nwell is doped to a higher concentration than the first n-type well N-well. Thus, the ESD protection transistor in the form of a PMOS transistor is formed in the second n-type well Nwell.

A $p^+$ source region and a $p^+$ drain region across a channel region are formed in the second n-type well. A gate G is formed above the channel region via an insulating layer. A deep insulation trench Td is formed, surrounding drains D each consisting of a $p^+$ drain region and a contact thereof, sources S each consisting of a $p^+$ source region and a contact thereof, and channel regions. Substrate contacts Csub each consisting of an $n^+$ substrate contact region and a contact thereof are formed outside the deep insulation trench Td.

The deep insulation trench Td extends beyond the thickness of the second n-type well Nwell and reaches the first n-type well N-well. The insulation trench Td, however, should not reach the p-type substrate Psub. Should the insulation trench Td reach the p-type substrate Psub, the second n-type well Nwell and the n+ substrate contact region would be separated (i.e. insulated) from each other by the insulation trench Td. It would be understood clearly from the above description that the n-type double well configuration can lower the trigger voltage Vtrig of the parasitic BJT, and at the same time prevent separation of the second n-type well Nwell and the n+ substrate contact region.

Also in this type of PMOS transistor the gate G, source S, and the substrate contact Csub of the transistor are connected to a supply potential Vdd to provide ESD protection against a negatively polarized surge to the drain D. The protective mechanisms of these embodiments are basically the same, irrespective of whether they are p-type or n-type that details of the mechanism of this embodiment will not be repeated.

In the fourth embodiment, the PMOS transistor allows easy operation of the parasitic BJT against a negatively polarized surge, thereby enhancing the ESD protection performance of the parasitic BJT. It will be appreciated that the trigger voltage Vtrig can be easily regulated in the n-type double well structure by varying the impurity concentration in the first n-type well N-well.

Figure 9:
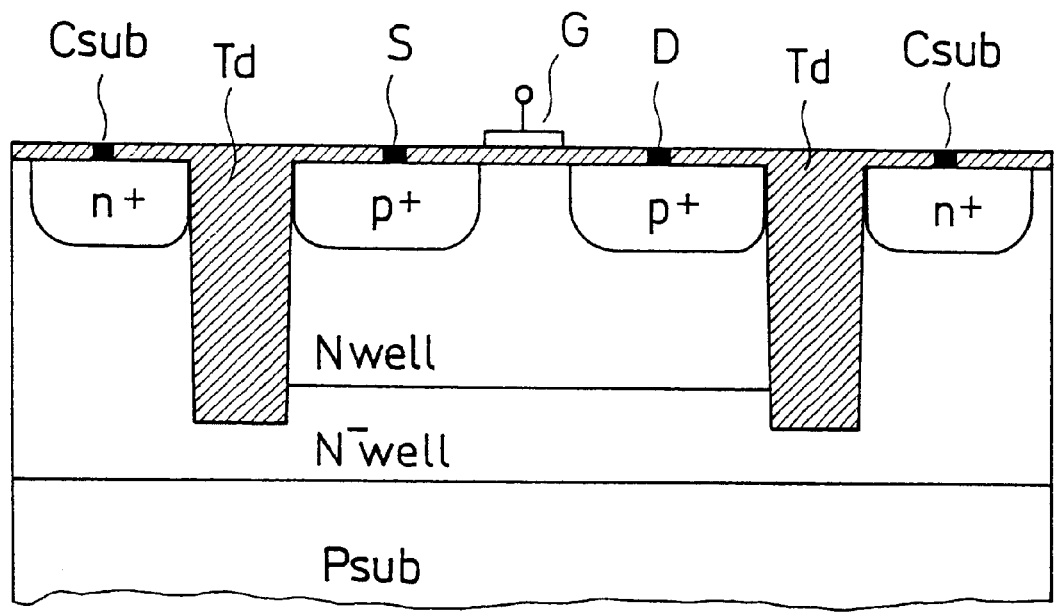
FIG. 9 shows a schematic cross section of a fifth embodiment of a PMOS ESD protection transistor according to the invention.

FIG. 9 shows a schematic cross section of a fifth embodiment of an ESD protection transistor of the invention.

The fifth embodiment of FIG. 9 is similar to the fourth embodiment shown in FIG. 8 in that they have an n-type double well configuration and that a deep insulation trench Td is formed as a guard ring surrounding a drain D, a source S, and a channel region.

However, in the fifth embodiment shown in FIG. 9, the substrate contacts Csub formed outside the deep insulation trench Td are provided in the lightly doped first n-type well N-well.

In other words, the second n-type well Nwell is formed only for the drains D, sources S, and the channel regions that are highly doped to perform MOS transistor operations. On the other hand, the substrate contacts Csub are formed directly in the first n-type well N-well, since the substrate contacts Csub can function without any problem if they are lightly doped.

Because of this configuration, the total resistance Rtot can be further increased to facilitate easy operation of the parasitic BJT and raise the voltage Vd applied to the base of the parasitic BJT to enhance its ESD protection capability, in just the same manner as in the third embodiment shown in FIG. 7.

I claim:

1. A semiconductor integrated circuit (IC) having an ESD protection transistor, said ESD protection transistor comprising:
   a first conductivity type well formed in a first conductivity type substrate;
   a second conductivity type source region formed in said first conductivity type well;
   a second conductivity type drain region formed in said first conductivity type well, away from said source region across a channel region;
   a first conductivity type substrate contact region formed in said first conductivity type well and on at least the opposite side of said channel region with respect to said drain region;
   a gate formed above, and insulated from, said channel region; and an insulation trench that extends to a depth beyond the thickness of said first conductivity type well and reaching said first conductivity type substrate, said insulation trench formed between at least said drain region and substrate contact region.

2. The semiconductor IC according to claim 1, wherein said gate, source region, and substrate contact region are connected to the same supply potential.

3. The semiconductor IC according to claim 1, wherein said insulation trench has a ring shape to surround said drain region, channel region and source region.

4. The semiconductor IC according to claim 3, wherein said substrate contact region is formed to further surround said ring shape insulation trench.

5. The semiconductor IC according to claim 1, wherein said ESD protection transistor is of 2-finger gate type that has a drain region and two source regions on the opposite sides of said drain region.

6. An IC having an ESD protection transistor, said ESD protection transistor comprising:
   a first conductivity type well formed in a first conductivity type substrate;
   an second conductivity type source region formed in said first conductivity type well;
   a second conductivity type drain region formed in said first conductivity type well, away from said source region across a channel region;
   a first conductivity type substrate contact region formed in said first conductivity type substrate and on at least the opposite side of said channel region with respect to said drain region;
   a gate formed above, and insulated from, said channel region; and
   an insulation trench that extends to a depth beyond the thickness of said first conductivity type well, said insulation trench formed between at least said drain region and substrate contact region.

7. The semiconductor IC according to claim 6, wherein said gate, source region, and substrate contact region are connected to the same supply potential.

8. The semiconductor IC according to claim 6, wherein said insulation trench has a ring shape to surround said drain region, channel region and source region.

9. The semiconductor IC according to claim 8, wherein said substrate contact region is formed to further surround said ring-shaped insulation trench.

10. The semiconductor IC according to claim 6, wherein said ESD protection transistor is of 2-finger gate type that has a drain region and two source regions on the opposite sides of said drain region.

11. An IC having an ESD protection transistor, said ESD protection transistor comprising:
   a first well of a second conductivity type formed in a first conductivity type substrate;
   a second well of the second conductivity type formed in said first well of the second conductivity type;
   a first conductivity type source region formed in said second well of second conductivity type;
   a first conductivity type drain region formed in said second well of the second conductivity type, away from said source region across a channel region;
   a second conductivity type substrate contact region formed in said second well of the second conductivity type, on at least the opposite side of said channel region with respect to said drain region;
   a gate formed above, and insulated from, said channel region; and an insulation trench that extends to a depth beyond the thickness of the first well of the second conductivity type and reaching said first well of the second conductivity type, and formed between said drain region and substrate contact region.

12. The semiconductor IC according to claim 11, wherein said gate, source region, and substrate contact region are connected to the same supply potential.

13. The semiconductor IC according to claim 11, wherein said insulation trench has a ring shape to surround said drain region, channel region and source region.

14. The semiconductor IC according to claim 13, wherein said substrate contact region is formed to further surround said ring-shaped insulation trench.

15. The semiconductor IC according to claim 11, wherein said ESD protection transistor is of 2-finger gate type that has a drain region and two source regions on the opposite sides of said drain region.

16. An IC having an ESD protection transistor, said ESD protection transistor comprising:
- a first well of a second conductivity type formed in a first conductivity type substrate;
- a second well of the second conductivity type formed in the first well of the second conductivity type;
- a first conductivity type source region formed in the second well of the second conductivity type;
- a drain region of the first conductivity type formed in the second well of the second conductivity type, away from said source region across a channel region;
- a substrate contact region of the second conductivity type formed in said first well of the second conductivity type and on at least the opposite side of said channel region with respect to said drain region;
- a gate formed above, and insulated from, said channel region; and
- an insulation trench that extends to a depth beyond the thickness of said second well of the second conductivity type, formed between said drain region and substrate contact region.

17. The semiconductor IC according to claim 16, wherein said gate, source region, and substrate contact region are connected to the same supply potential.

18. The semiconductor IC according to claim 16, wherein said insulation trench has a ring shape to surround said drain region, channel region and source region.

19. The semiconductor IC according to claim 18, wherein said substrate contact region is formed to further surround said ring shape insulation trench.

20. An IC, comprising:
a transistor having:
- a highly doped well of a first conductivity type formed in a semiconductor substrate;
- a second conductivity type source region formed in said well of the first conductivity type;
- a drain region of the second conductivity type formed in said well of the first conductivity type, away from said source region across a channel region;
- a gate formed above, and insulated from, said channel region; and
- a substrate contact region of the first conductivity type formed in the said well of the first conductivity type, on at least the opposite side of said channel region with respect to said drain region, an insulation trench formed between at least said drain region and said substrate contact region, and an internal circuit connected to said drain region, wherein said gate, source region, and substrate contact region are connected to the same potential; and said insulation trench has a depth such that said transistor becomes conductive before said internal circuit or said transistor is destructed by an anomalous voltage entering the drain region.

* * * * *